United States Patent [19]
Montegari

[11] Patent Number: 5,465,230
[45] Date of Patent: Nov. 7, 1995

[54] READ/WRITE/RESTORE CIRCUIT FOR MEMORY ARRAYS

[75] Inventor: Frank A. Montegari, Wappingers Falls, N.Y.

[73] Assignee: International Business Machines Corporation, Armonk, N.Y.

[21] Appl. No.: 808,047

[22] Filed: Dec. 12, 1991

Related U.S. Application Data

[63] Continuation of Ser. No. 525,286, May 17, 1990, abandoned.

[51] Int. Cl.⁶ .................................................. G11C 11/56
[52] U.S. Cl. ................ 365/168; 365/177; 365/190; 365/203; 365/208; 365/189.11; 365/233; 365/225.6
[58] Field of Search ........................ 365/203, 190, 365/208, 168, 177, 225.6, 233, 189.11

[56] References Cited

U.S. PATENT DOCUMENTS

| | | | |
|---|---|---|---|
| 4,198,700 | 4/1980 | Aoyama et al. | 365/230 |
| 4,397,000 | 8/1983 | Nagami | 365/190 |
| 4,405,868 | 9/1983 | Lockwood | 307/296 A |
| 4,528,646 | 7/1985 | Ochii et al. | 365/203 |
| 4,531,068 | 7/1985 | Kraft et al. | 307/473 |
| 4,616,342 | 10/1986 | Miyamato et al. | 365/203 |
| 4,636,990 | 1/1987 | Buscaglia et al. | 365/230 |
| 4,644,196 | 2/1987 | Flannagan | 365/190 |
| 4,658,381 | 4/1987 | Reed et al. | 365/203 |
| 4,665,505 | 5/1987 | Miyakawa et al. | 365/177 |
| 4,678,940 | 7/1987 | Vasseghi et al. | 307/446 |
| 4,678,943 | 7/1987 | Uragami et al. | 307/473 |
| 4,686,396 | 8/1987 | Law et al. | 307/473 |
| 4,730,279 | 3/1988 | Oktani et al. | 365/203 |
| 4,752,913 | 6/1988 | Chan et al. | 365/190 |
| 4,817,057 | 3/1989 | Kondo et al. | 365/203 |
| 4,821,237 | 4/1989 | Iwahashi | 365/189 |
| 4,825,413 | 4/1989 | Tran | 365/190 |
| 4,829,479 | 5/1989 | Mitsumoto et al. | 365/189.09 |
| 4,839,862 | 6/1989 | Shiba et al. | 365/154 |
| 4,841,484 | 6/1989 | Watanabe et al. | 365/190 |
| 4,853,898 | 8/1989 | Hashemi et al. | 365/190 |
| 4,858,194 | 8/1989 | Terado et al. | 365/203 |
| 4,862,421 | 8/1989 | Tran | 365/189.07 |
| 4,866,674 | 9/1989 | Tran | 365/189.11 |
| 4,882,507 | 11/1989 | Tatsumi et al. | 307/473 |
| 4,910,714 | 3/1990 | Hartgring | 365/208 |
| 4,953,127 | 8/1990 | Nagahashi et al. | 365/190 |
| 4,961,168 | 10/1990 | Tran | 365/208 |
| 4,967,102 | 10/1990 | Mahler | 307/473 |

OTHER PUBLICATIONS

IBM TDB, vol. 16, No. 8, Jan. 1974, pp. 2677–2678, "Tristate Driver Utilizing Bipolar–Complementary Metal Oxide Semiconductor Technology".

IBM TDB, vol. 19, No. 11, Apr. 1975, pp. 3338–3339, "Lower Power FET Storage Cell".

*Primary Examiner*—Joseph E. Clawson, Jr.
*Attorney, Agent, or Firm*—Charles W. Peterson, Jr.

[57] ABSTRACT

A read/write/restore circuit is disclosed for use in a memory array such as a static RAM array. The circuit employs data and data-complement signals having three states in combination with a two-state address signal to perform read, write and restore functions for the array, to reduce the number of components and control lines needed. The circuit is preferably implemented in BICMOS technology.

11 Claims, 5 Drawing Sheets

(DATA RECEIVER AND 3-STATE DRIVER)

READ/WRITE/RESTORE CIRCUIT FOR MEMORY ARRAYS

This application is a continuation of application Ser. No. 07/525,286, filed May 17, 1990 now abandoned.

CROSS-REFERENCE TO RELATED U.S. APPLICATION

Reference is made to U.S. patent application Ser. No. 07/525,422, abandoned, filed concurrently herewith, by P. Phillips et al., entitled "Switchable Current Source," and assigned to the assignee of the present invention.

BACKGROUND OF THE INVENTION

1. Field of the Invention

The present invention relates to peripheral circuitry for a memory array, and more particularly to circuitry for use in reading and writing the cells, and restoring the cell bit lines, of a static random access memory (SRAM) array. The invention may be implemented in BICMOS technology.

2. Description of the Related Art

High-speed SRAM arrays are typically constructed of memory cells arranged in rows and columns to form a matrix. The cells of each column are coupled to a pair of bit lines, and the cells of each row are coupled to a word line. The bit lines and word line are coupled to peripheral circuitry for selecting particular columns and rows of cells for the reading or writing of data from or to the cells. A restore or precharge operation is also typically performed over the bit lines after a write operation in order to prepare the column of cells for a new operation and to provide the highest speed.

Thus, the peripheral circuitry servicing a column of SRAM cells generally must be capable of performing at least six different operations—select the column (i.e., select or address the bit lines) for reading; read the cells of that column (i.e., sense the data); select the bit lines for writing data; write a "0" in the cells; write a "1;" and restore the bit lines.

Because these memory operations are so different, prior art circuitry for performing these operations normally has consisted of separate circuits for selecting, reading, writing and restoring. This, however, has several disadvantages. Not only do such individual circuits each contain numerous devices, but they require several different input signals (such as read enable, write enable, chip enable, restore, etc.), and several internal control lines within the array for proper operation and interconnection. For example, at least four separate input lines are often required (namely, bit address, restore, data and data complement), and the circuitry for sensing data for read-out also often requires its own bit address line attachment.

As memories (particularly semiconductor memories) grow in complexity yet shrink in size, the arrays are becoming increasingly crowded. Thus, the number and placement of internal control lines and input/output (I/O) lines is coming under increasing scrutiny. High density and high speed also remain important design criteria for array circuitry for use on a semiconductor chip. There is a growing need, therefore, to simplify the read, write and restore circuitry by reducing the device count, combining functions, reducing the number of control lines and the like, while maintaining high density and high speed.

SUMMARY OF THE INVENTION

The present invention is intended to meet the above needs and remedy the above disadvantages of the prior art by combining several functions into a single circuit, reducing the number of components and reducing the number of control lines. The invention is preferably implemented in BICMOS technology (i.e., a circuit having both bipolar and field-effect or MOS transistors (FETs) on the same semiconductor chip) to provide high speed operation and high density at relatively low power.

In one embodiment, the present invention comprises a memory comprising:

memory cells, each cell coupled to a pair of bit lines; and read/write/restore means coupled to the bit lines for reading and writing the cells and restoring the bit lines in response to a two-state address signal in timed relationship with a three-state data signal and a three-state data complement signal.

In another embodiment, the present invention comprises a memory comprising:

a plurality of memory cells, each cell being coupled to a pair of bit lines;

read/write/restore means coupled to the bit lines for performing read enable, write 0, write 1 and restore functions for all cells coupled to the bit lines in response to a two-state bit address signal, a three-state data signal and a three-state data complement signal, each such signal being received by the read/write/ restore means in proper timed relationship over a different input signal line; and read sense means coupled to the bit lines and separate from the read/write/restore means for performing a read sense function for all cells coupled to the bit lines.

In yet another embodiment, the present invention comprises a semiconductor static random access memory comprising:

a plurality of CMOS or BICMOS memory cells, each cell being coupled to a pair of bit lines;

a BICMOS read/write/restore circuit coupled to the bit lines and to data, data complement and bit address lines, for performing read enable, write 0, write 1 and restore functions for all cells coupled to the bit lines in response to data, data complement and bit address signals, the data and data complement signals each having three states and the bit address signal having two states; and a bipolar read sense circuit, coupled to the bit lines and physically separate from the read/write/ restore circuit, and having no bit address input terminal, for performing a read sense function for cells coupled to the bit lines.

BRIEF DESCRIPTION OF THE DRAWINGS

To facilitate further description of the invention, the following drawings are provided in which.

DETAILED DESCRIPTION OF THE PREFERRED EMBODIMENT

Figure 1:
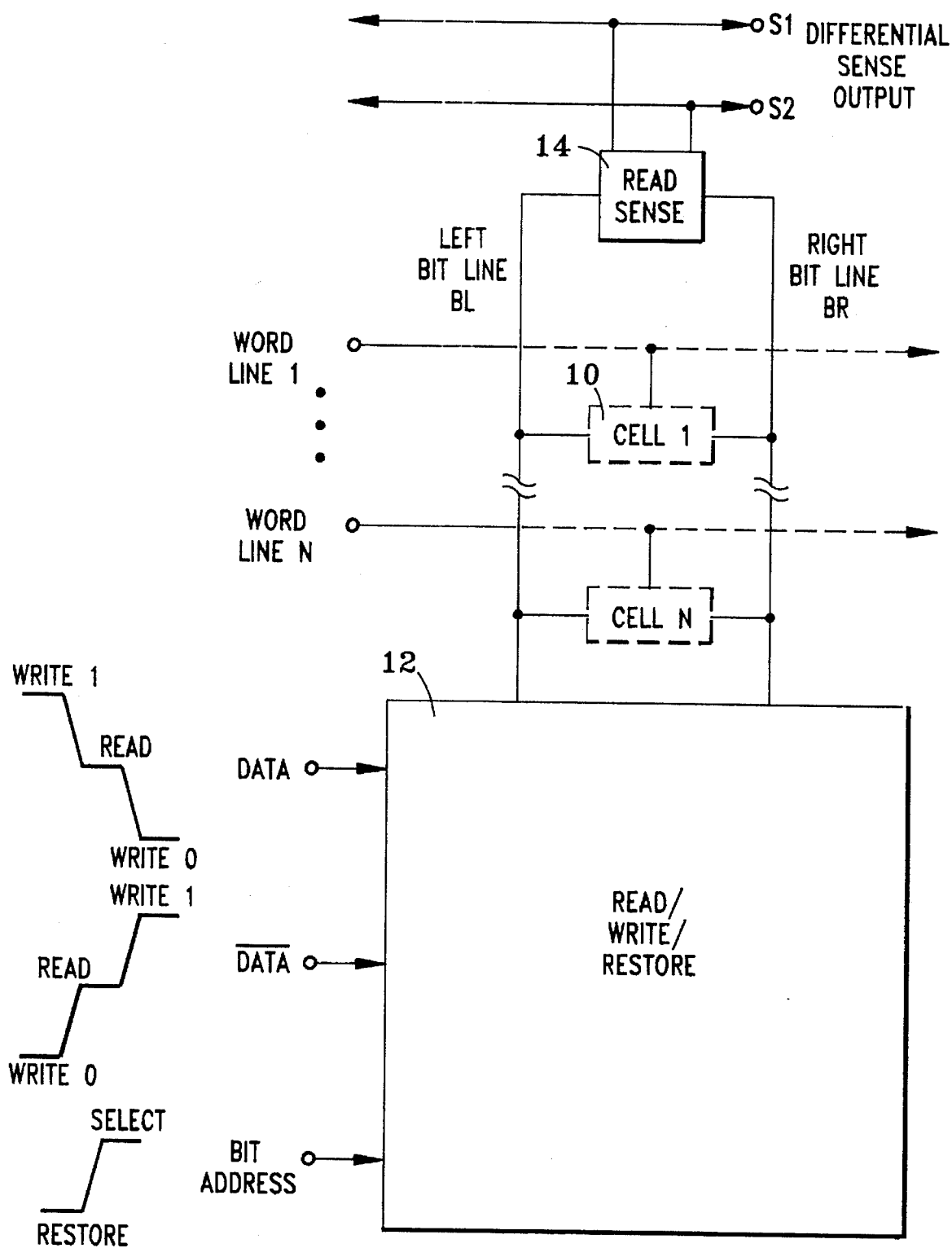
FIG. 1 is a block diagram of a memory array with associated read/write/restore and read sense circuitry in accordance with the invention.

Referring first to FIG. 1, there is shown therein an overall block diagram of a memory array and associated read/write/ restore and read sense circuits, illustrating an environment in which the present invention may find application. The invention is not, however, limited to this particular environment.

In FIG. 1, a plurality of memory cells 10 are provided for the storage of binary data. The cells are arranged in rows and columns, in the form of a matrix. The preferred type of this memory is a static random access memory (static RAM or SRAM), suitable for fabrication on a semiconductor chip. Each cell may be a conventional single-bit SRAM cell, such as a 6-device CMOS or BICMOS cell similar to that disclosed in the article, "Low-Power FET Storage Cell," by R. H. Linton, et al., in IBM *Technical Disclosure Bulletin*, Vol. 17, No. 11, pp. 3338–39 (April 1975), and elsewhere.

The memory is not limited to any particular size or organization. It could, for example, be a 256 Kbit, 512 Kbit or 1 Megabit SRAM.

As shown in FIG. 1, each cell in each column is attached to a pair of bit lines (e.g., left bit line BL and right bit line BR) and each cell in each row is attached to at least one word line. Individual cells are selected (addressed) for reading and writing by way of signals on the particular pair of bit lines and the word line for that cell. The bit lines for the cells are also "unselected" or restored (precharged) after each read or write operation via restore signals on the same bit and word lines.

Coupled to each pair of bit lines is a read/write/restore circuit 12 in accordance with the present invention. Circuit 12 is arranged to perform several functions on the cells attached to these bit lines, specifically read enable, write 0, write 1 and restore, in response to three input signals, namely bit address, data and data complement, applied to the read/write/restore circuit through respective bit address, data and data complement terminals.

The bit address signal is a two-state or binary signal, one state of which is active during a "select" portion of a memory cycle, when circuit 12 selects the bit lines at the proper time for reading and writing, and the other state of which is active during a "restore" portion of the memory cycle, when circuit 12 restores the bit lines at the proper time after a read or write operation. The bit address signal may be generated by a conventional bit decoder circuit (not shown). It should be noted that a single input terminal for the bit address signal is used by circuit 12 for both select and restore, thus eliminating the need for a separate restore terminal or control line.

The other two input signals for use in driving read/write/ restore circuit 12 are data and data complement signals. A noteworthy feature of these signals is that each has three operative states or levels instead of the two states found in prior art peripheral circuits. In the present invention, one state represents a logical "0" state or level, as data available for writing into the cells; another state represents a logical "1" state or level, as data available for writing into the cells; and the third state represents a neutral state or level for use by circuit 12 in initiating a read function for the cells at the proper time, in conjunction with the bit address signal. In the preferred embodiment, the neutral state is a level approximately half-way between the "0" state and the "1" state, but other levels could also be used. The operation and timing relationships of the three input signals are described in more detail below.

Another feature of the invention is a read sense circuit 14 as shown in FIG. 1. Circuit 14 is coupled to bit lines BL and BR, and performs a data sensing function during a memory read operation. Reading data in the cells is accomplished by sensing the difference between signal levels on the two bit lines. Circuit 14 performs this differential sense function for output to a pair of sense lines S1 and S2. A noteworthy feature of circuit 14 is that no control lines (such as for bit address or read enable) are required for operation. The circuit is arranged to produce a differential output based only upon data signals received over the bit lines from the selected memory cells. This not only eliminates the need for additional lines running through the array, but also permits read sense circuit 14 to be located at any point along the bit lines. For example, the sense circuits could be located at the opposite side of the array from the read/write/re- store circuit 12, which increases flexibility for semiconductor chip design and circuit layout.

Figure 2:
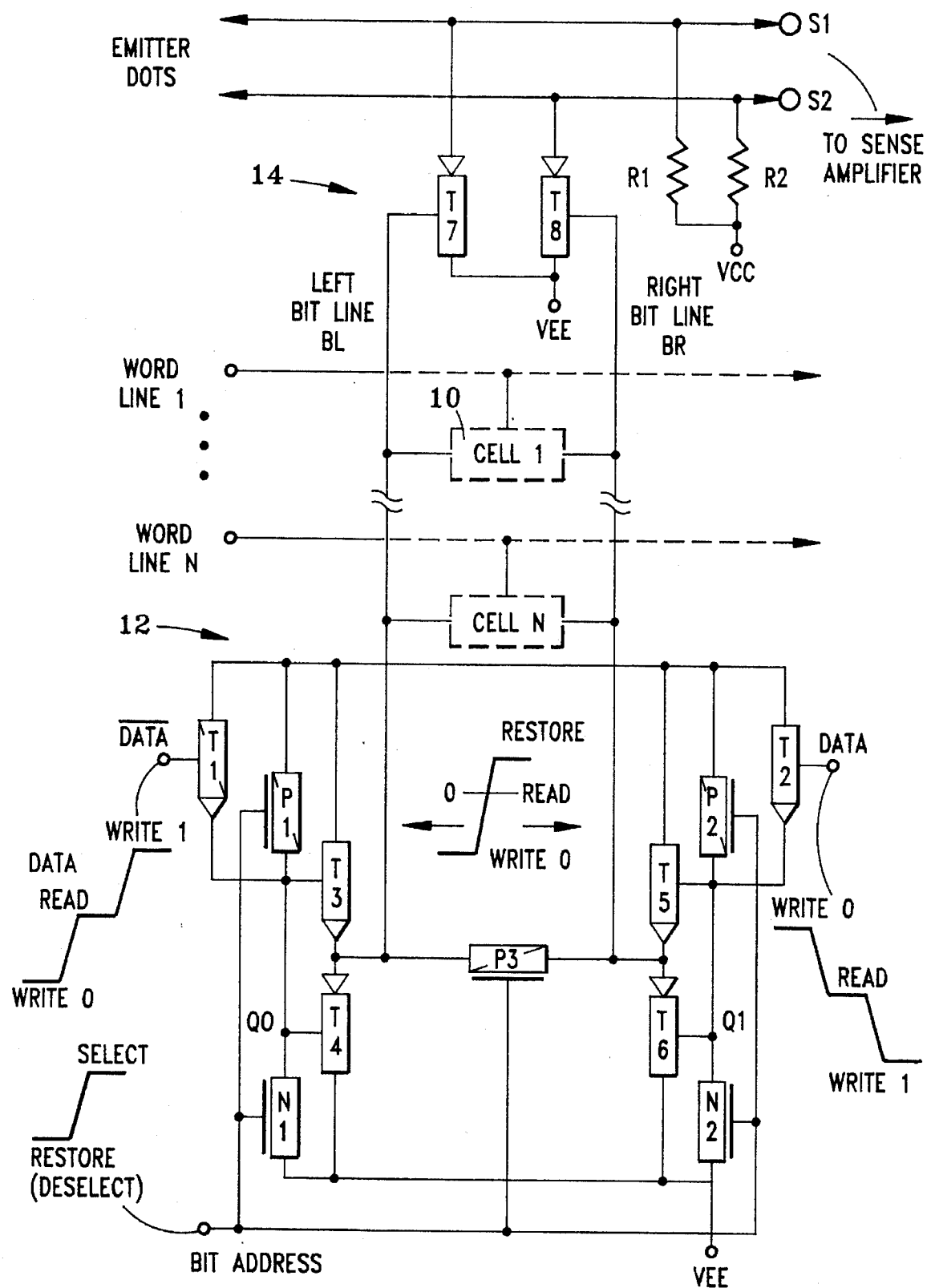
FIG. 2 is a schematic circuit diagram of the read/write/ restore and read sense circuits of FIG. 1.

Specific embodiments of the circuits of FIG. 1 are shown in FIG. 2. In the preferred embodiment, read/write/restore circuit 12 comprises a BICMOS circuit having six bipolar transistors and five FETs. Bipolar transistors T1 and T2, which are preferably of the NPN type, are coupled at their base terminals to the data and data complement input terminals, respectively for receiving the three-state data and data complement signals. The emitter output of T1 is coupled to both bases of a pair of bipolar transistors T3 and T4, and the emitter output of T2 is coupled to both bases of a similar pair of bipolar transistors T5 and T6. In the preferred embodiment, T3 and T5 are NPN transistors and T4 and T6 are PNP transistors. The emitters of T3 and T4 are tied together and to the left bit line BL, and the emitters of T5 and T6 are tied together and to the right bit line BR. The collectors of T1, T2, T3 and T5 are tied to a first voltage source, VCC, and the collectors of T4 and T6 are tied to a second voltage source, VEE.

In addition to the bipolar transistors as described above, read/write/restore circuit 12 includes five FETs. Four of these devices, namely P1, N1, P2 and N2, are coupled at their gates to the bit address input terminal, as shown in FIG. 2. Devices P1 and P2 are preferably P-channel FETs whose source terminals are coupled to VCC, and devices N1 and N2 are preferably N-channel FETs whose source terminals are coupled to VEE. The drains of P1 and N1 are coupled together and to the emitter of T1, and the drains of P2 and N2 are coupled together and to the emitter of T2.

Completing circuit 12 is a fifth FET, P3, which is preferably a P-channel FET whose source and drain terminals are coupled between the left and right bit lines, and whose gate terminal is coupled to the bit address line.

Read sense circuit 14 of FIG. 2 comprises two bipolar transistors T7 and T8, which are PNP transistors in the preferred embodiment. The base of T7 is coupled to the left bit line and the base of T8 is coupled to the right bit line. The emitters of both T7 and T8 are coupled to sense lines S1 and S2, respectively, and the collectors are coupled together and to VEE. Devices T7 and T8 have low impedance drive capability and are not sensitive to capacitive loading or dotting at their emitters.

Additional elements in the preferred embodiment are load elements coupled between sense lines S1, S2 and VCC. In FIG. 2, these are resistors R1 and R2, but these resistors could be replaced by FETs.

Figure 3:
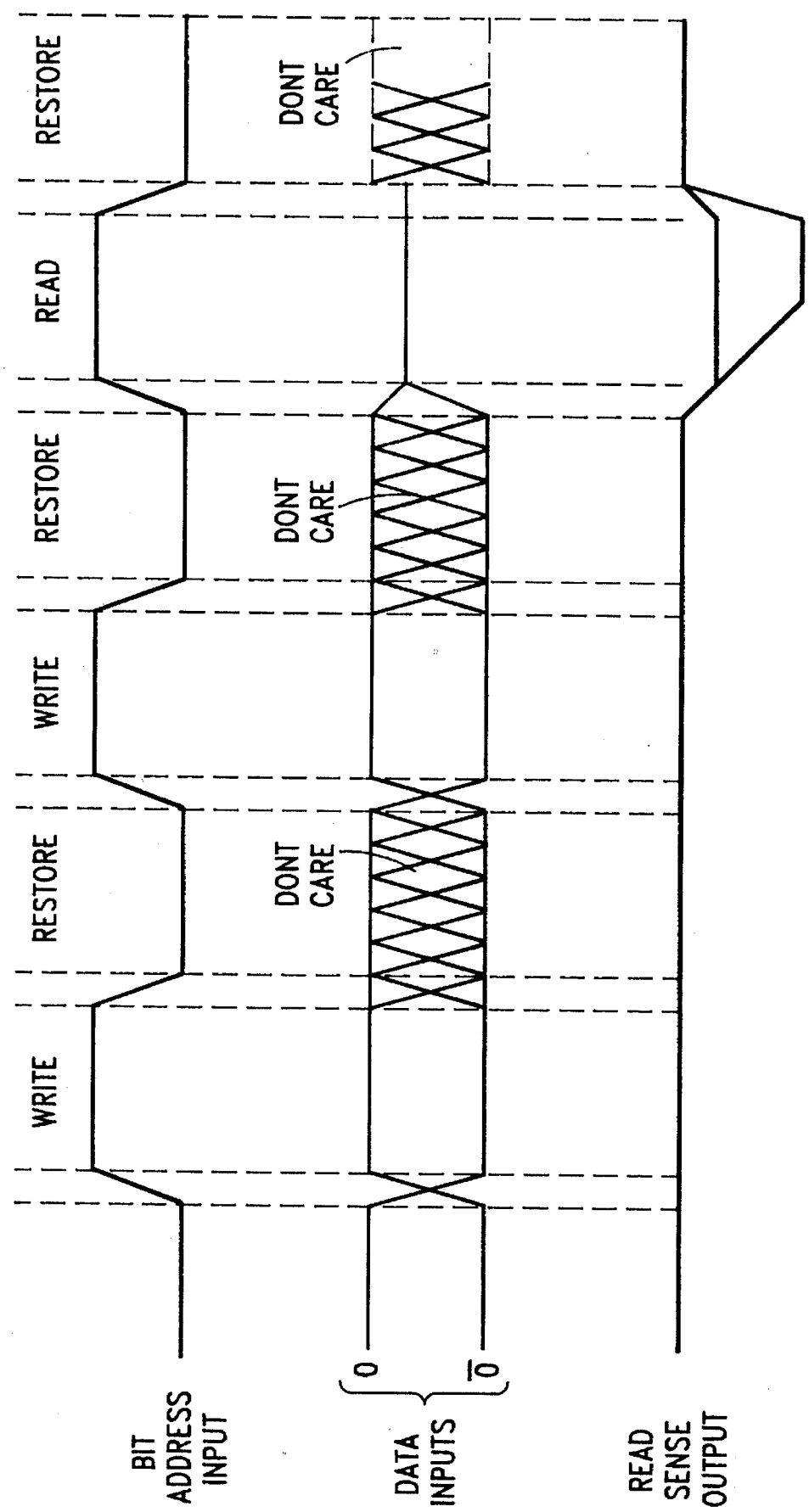
FIG. 3 is a series of waveform (timing) diagrams showing the read, write and restore operations of the circuits of FIGS. 1 and 2.

The operation of the circuit of FIG. 2 will now be described, as may be visualized in FIG.3.

To write data into a cell, such as a 0 through the left bit line, a relatively high voltage level is applied to the data input (the base of T2), a relatively low or negative voltage level is applied to the data complement input (the base of T1), and a high level is applied to the bit address input (the gates of P1, P2, P3, N1 and N2). With the address input being high, both N1 and N2 are on, but node Q1 is clamped by T2 while node Q0 is pulled down. The level at Q1 is further shifted through T5 but remains high, resulting in a high level on bit line BR while the low level at Q0 pulls bit line BL low through T4, thus writing a 0 into bit line BL and a 1 into bit line BR. To change the state of the memory cell, the levels at the data inputs are reversed and the bit address input is again selected by a high level.

To restore the bit lines after writing, the bit address signal is switched to the deselect state by applying a low level. This turns both P1 and P2 on, and both bit lines are pulled to a restore level through T3 and T5. The states of the data and data complement signals are irrelevant during a restore.

To read a cell, the neutral voltage of the data and data complement signals is applied to both data inputs, and are shifted down through T1 and T2 at Q0 and Q1 and then shifted back up through T4 and T6 to the neutral level at bit lines BL and BR. This neutral level turns both sense amp emitter follower transistors T7 and T8 on. The level on both Q0 and Q1 turn T3 and T4 off, allowing either bit line to be pulled further down by the conducting side of the memory cell that is addressed by an up level on its word line. This creates a differential voltage between bit lines that is transferred through emitter followers T7 and T8 to the sense lines and then into a differential voltage amplifier (not shown). Sense emitter followers are dotted at sense lines S1 and S2, but deselected bit lines are restored so that only the sense emitter followers on selected bit lines are conducting.

To further reduce power dissipation, sense load resistors R1 and R2 may be replaced by PFETs whose gates are driven by a read/write pulse to prevent T7 or T8 from conducting during write.

Figure 4:
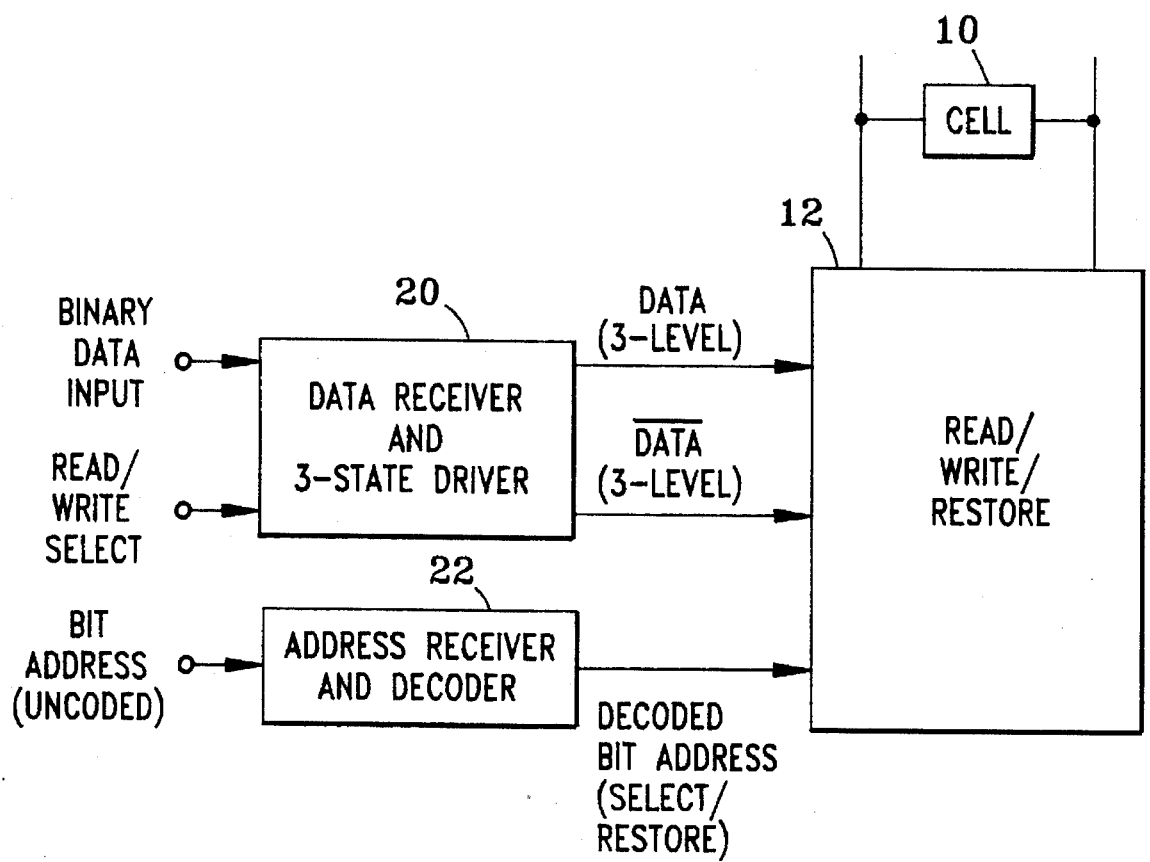
FIG. 4 is a block diagram of the read/write/restore circuit of FIG. 1 illustrating a use of such circuit in combination with a data receiver and 3-state driver circuit and with an address receiver and decoder circuit.

FIG. 4 shows in block diagram form a data receiver and 3-state driver circuit 20 for use in generating the 3-state data signals for input to the read/write/restore circuit 12, in response to binary data signals and a read/write select signal, in accordance with the invention. An address receiver and decoder 22 may also be employed to decode the bit address signals.

Figure 5:
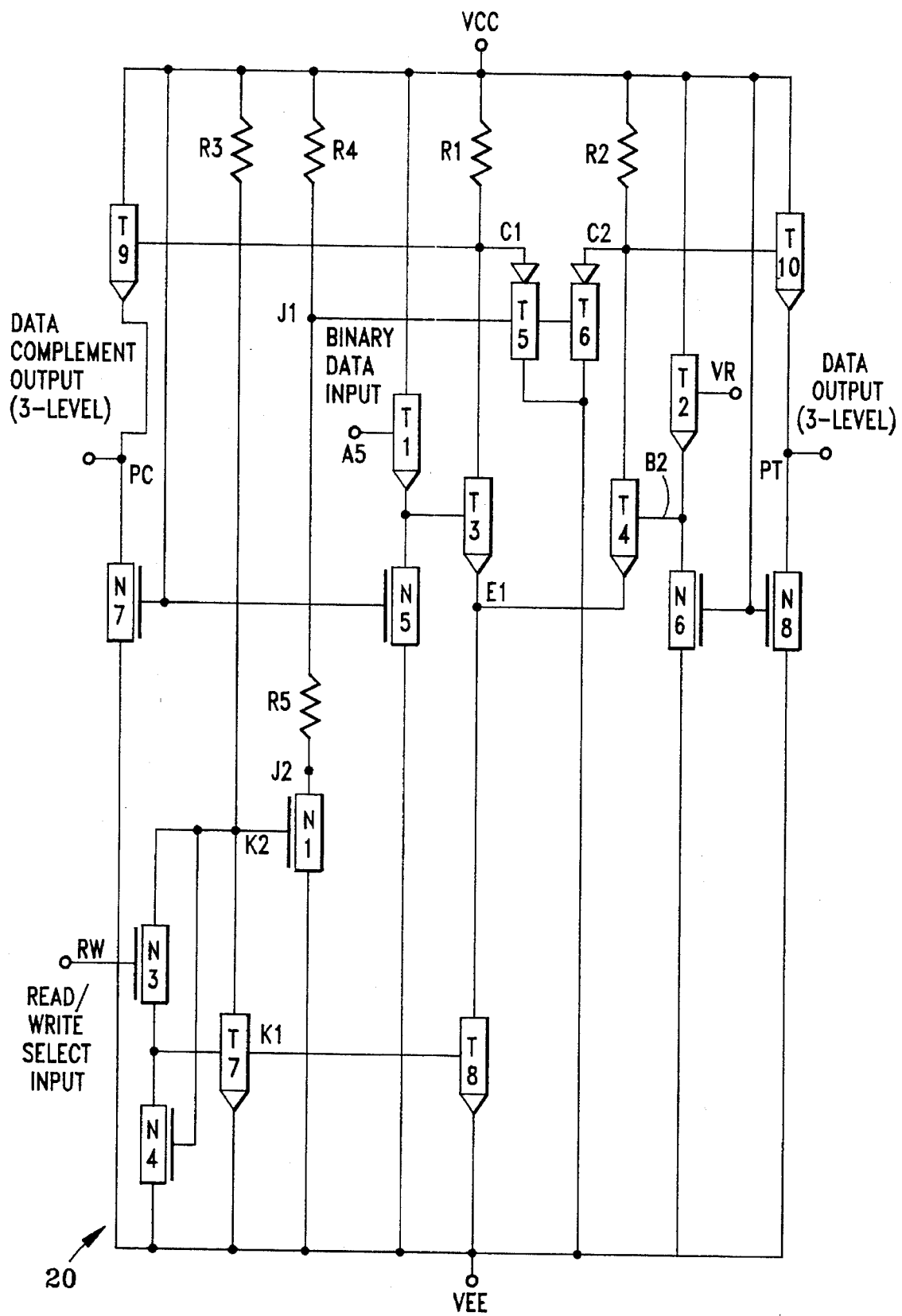
FIG. 5 is a schematic circuit diagram of the data receiver and 3-state driver circuit of FIG. 4.

FIG. 5 is a specific embodiment, in BICMOS technology, of the data receiver and 3-state driver circuit of the invention.

The data receiver and 3-state driver produces either a TRUE (data level 1) or a complement (data level 0) output at nodes PT and PC when a 0 or 1 data input is applied to node A5 and a READ/WRITE control input up level (1), representing a write state is applied to node RW.

The receiver also produces a third, neutral state which is a level between a 0 and a 1 at both outputs simultaneously when a down level (0) read input is applied to node RW, regardless of the data input level at node A5.

Bipolar transistors T1, T2, are emitter followers that provide a high input impedance to the data and VR (input reference) inputs and shift the data and reference levels down one $V_{be}$. NFETs N5, N6, with their gates connected to $V_{cc}$, are used as pulldowns instead of using resistors due to their more constant current characteristics. The lower levels at the bases of T3, T4, allow ECL circuit T3, T4, to supply a larger transition at collector nodes C1, C2, without approaching saturation. Emitter followers T9, T10, with NFET pulldowns N7, N8, supply low impedance drive to the data inputs of the Read/Write/Restore circuit of FIGS. 1, 2 and 4.

Devices N3, N4, T7 and R3 form a switchable reference generator that turns ECL circuit T3, T4, on when an up level is applied to the gate of N3. A conductive path is produced by N3 from the collector to base of T7, thus forming a diode that, together with R3, generates a base-emitter reference voltage that is connected to T8 which mirrors the T7 collector current. Pulldown N4 turns T7 off when a down level (0) read input appears at node RW and turns N3 off.

With a read input present at RW, T7 is off, its collector node K2 is pulled up to $V_{cc}$ by R3 and its base node K1 is pulled down to $V_{cc}$ by N4, turning T8 and therefore the entire ECL circuit (T3, T4) off. With node K2 at $V_{cc}$, NFET N1 turns on and pulls its drain node, J2 down to $V_{ee}$. This results in a current flow through R4, R5, that produces a neutral voltage level at node J1 causing PNP emitter followers T5, T6, to pull both nodes C1, C2, down simultaneously to one $V_{be}$ above the neutral level. The levels at C1, C2 are then shifted down again through T9, T10, where they are available at nodes PC, PT, to drive the data inputs of the read/write/restore circuit and produce a read state in that circuit.

It is noteworthy that only one 3-state driver circuit is needed for the entire array.

While the invention has been particularly shown and described with reference to the preferred embodiments thereof, it will be understood by those skilled in the art that various changes in form and detail may be made therein without departing from the spirit and scope of the invention. For example, the NFET transistors in the embodiments could be replaced by PFET transistors, and vice versa, with appropriate modification, and the NPN bipolar transistors could be replaced by PNP transistors, and vice versa, with appropriate modification. The invention may also, for example, find application in other types of memories, such as multiple port (using different cells), read-only, optical or electro-optical.

I claim:

1. A memory comprising:

CMOS memory cells, each cell coupled to a pair of bit lines; and read/write/restore means coupled to the bit lines for reading and writing the cells and restoring the bit lines in response to a two-state address signal in timed relationship with a three-level data and data complement signal pair.

2. The memory of claim 1 in which:

the first state of the address signal, in combination with the first or second level of the data and data complement signals, serves to initiate a write function;

the first state of the address signal, in combination with the third level of the data and data complement signals, serves to initiate a read function; and the second state of the address signal serves to initiate a restore function.

3. A memory comprising:

a plurality of CMOS memory cells, each cell being coupled to a pair of bit lines;

read/write/restore means coupled to the bit lines for performing read enable, write 0, write 1 and restore functions for all cells coupled to the bit lines in response to a two-state bit address signal on a first input signal line, a three-level data and data complement signal pair on a second and third input signal line, each such signal being received by the read/write/restore means in proper timed relationship; and read sense means coupled to the bit lines and separate from the read/write/restore means for performing a read sense function for all cells coupled to the bit lines.

4. The memory of claim 3 in which the read sense means is responsive to selection of said bit lines by said read/write/restore means.

5. The memory of claim 3 in which the cells are located between the read/write/restore means and the read sense means.

6. A semiconductor static random access memory comprising:

a plurality of CMOS memory cells, each cell being coupled to a pair of bit lines;

a BICMOS read/write/restore circuit coupled to the bit lines and to data, data complement and bit address lines, for performing read enable, write 0, write 1 and restore functions for all cells coupled to the bit lines in response to data, data complement and bit address signals, the data and data complement signals each having three levels and the bit address signal having two states; and a bipolar read sense circuit, coupled to the bit lines separate from the read/write/restore circuit by at least one memory cell responsive to selection of said bit lines by said read/write/restore circuit and whereby data is read from said bit lines.

7. A circuit for reading, writing and restoring the cells of a static random access CMOS memory array, comprising:

a first input line arranged to carry a three-level data signal representing read enable, write 0 and write 1;

a second input line arranged to carry a three-level data complement signal representing read enable, write 0 and write 1;

a third input line arranged to carry a two-level bit address signal representing read/write select and restore;

a left bit line and a right bit line, each coupled to one or more memory cells;

a BICMOS read/write/restore circuit coupled to the input lines and to the bit lines for initiating a write data operation, a read enable operation, and a restore operation, in response to particular level combinations of the data, data complement and bit address signals; and a bipolar read sense circuit having inputs coupled only to the bit lines, and having outputs coupled to a differential amplifier circuit, for sensing data in the cells in response to the read enable operation.

8. The circuit of claim 7 further including a sense load circuit coupled to outputs of the read sense circuit.

9. The circuit of claim 7 in which the read/write/restore circuit comprises a circuit of six bipolar transistors and five field-effect transistors.

10. The circuit of claim 7 in which the read sense circuit comprises a circuit of two bipolar transistors.

11. The circuit of claim 7 in which the read/write/restore circuit comprises:

first and second bipolar transistors having control terminals coupled to the first and second input lines, respectively;

third and fourth bipolar transistors having control terminals coupled to an output terminal of the first bipolar transistor, and having output terminals coupled together and to the left bit line;

fifth and sixth bipolar transistors having control terminals coupled to an output terminal of the second bipolar transistor, and having output terminals coupled together and to the right bit line;

first and second field-effect transistors (FETS) having control terminals coupled to the third input line and having output terminals coupled together and to the control terminals of the third and fourth bipolar transistors;

third and fourth FETS having control terminals coupled to the third input line and having output terminals coupled together and to the control terminals of the fifth and sixth bipolar transistors; and a fifth FET having its control terminal coupled to the third input line and having output terminals coupled between the left bit line and the right bit line.

* * * * *

UNITED STATES PATENT AND TRADEMARK OFFICE
CERTIFICATE OF CORRECTION

PATENT NO. : 5,465,230
DATED : November 7, 1995
INVENTOR(S) : Frank A. Montegari It is certified that error appears in the above-indentified patent and that said Letters Patent is hereby corrected as shown below:

Claim 6, Col. 7, line 25, before "BICMOS"

insert --Bipolar CMOS--.

Signed and Sealed this

Fifteenth Day of July, 1997

Attest:

BRUCE LEHMAN

Attesting Officer     Commissioner of Patents and Trademarks